United States Patent
Ding et al.

(10) Patent No.: US 7,058,880 B1
(45) Date of Patent: Jun. 6, 2006

(54) TECHNIQUES FOR PROGRAMMING AND VERIFYING DATA IN A PROGRAMMABLE CIRCUIT

(75) Inventors: Weiying Ding, Cupertino, CA (US); Brad Vest, San Jose, CA (US)

(73) Assignee: Altera Corporation, San Jose ( * ) Notice: Subject to any disclaimer, the term of this patent is extended or adjusted under 35 U.S.C. 154(b) by 515 days.

(21) Appl. No.: 10/032,832

(22) Filed: Dec. 26, 2001

(51) Int. Cl.
*H06F 11/00* (2006.01)
*G11B 5/09* (2006.01)

(52) U.S. Cl. .................... 714/799; 714/48; 714/746; 714/718; 360/53

(58) Field of Classification Search ................ 714/763, 714/724, 799, 48, 718, 746; 360/53
See application file for complete search history.

(56) References Cited

U.S. PATENT DOCUMENTS

| | | | | |
|---|---|---|---|---|
| 5,479,370 A | * | 12/1995 | Furuyama et al. | 365/189.12 |
| 5,598,108 A | | 1/1997 | Pedersen | |
| 5,668,772 A | * | 9/1997 | Hotta | 365/230.06 |
| 5,970,005 A | * | 10/1999 | Yin et al. | 365/201 |
| 5,996,091 A | * | 11/1999 | Jones et al. | 714/37 |

OTHER PUBLICATIONS

Altera Corporation "MAX 7000 Programmable Logic Device Family" May 1999.
Prepared by the In-System Configuration Working Group of the Test Technology Technical Council of the IEEE Computer Society, "Draft Standard for In-System Configuration of Programmable Devices", IEEE, Unapproved Draft May 5, 2000.

* cited by examiner

*Primary Examiner*—Albert Decady
(74) *Attorney, Agent, or Firm*—Townsend and Townsend and Crew, LLP

(57) ABSTRACT

The present invention includes techniques for programming and verifying data in a programmable circuit. Programmable circuits such as PLDs may include a plurality of rows and columns of memory cells. Data is programmed into memory elements associated with the rows and columns. Subsequently, the programmed data may be extracted for verification. A first word line may be selected by first word line address bits in row shift registers. Data programmed into the first word line is loaded into column shift registers for verification during one or more verify steps. During a program step, data is programmed into memory elements in a second word line that is selected by the first word line address bits. The present invention also provides a technique for shifting program data bits into the column shift registers at the same time that verify data bits are shifted out of the column shift registers.

26 Claims, 7 Drawing Sheets

TECHNIQUES FOR PROGRAMMING AND VERIFYING DATA IN A PROGRAMMABLE CIRCUIT

BACKGROUND OF THE INVENTION

The present invention relates to techniques for programming and verifying data in a programmable circuit, and more specifically, to techniques for programming and verifying data in a programmable circuit that saves time and reduces the vector count.

Data bits can be programmed into memory cells of a programmable circuit during a program step. Subsequently, the accuracy of the data bits programmed into the memory cells can be verified during a verify step. Prior art techniques for programming and verifying data in a programmable circuit require an undesirably long delay time and a high vector count.

During a program step, a first set of address bits is shifted into row shift registers that selects the word lines, and a set of program data bits is shifted into column shift registers for each word line. During a verify step, a second set of address bits is shifted into the row shift registers that selects the word lines, and verify data bits are shifted out of the column shift registers for each word line.

Each word line is selected twice, once for programming data in each word line and once for verifying data in each word line. Also, the program data bits are shifted into the column shift registers separately from when the verify data bits are shifted out of the column shift registers. Thus, the number of times that data bits are shifted into and out of the column shift registers is twice the number of word lines.

If a second verify step is performed, a third set of address bits is shifted into the row shift registers that selects the word lines, and verify data bits are shifted out of the column shift registers for each word line. Thus, if two verify steps are performed, each word line is selected three times to perform the program step and the verify steps, and the number of times that data bits are shifted into and out of the column shift registers is three times the number of word lines.

Loading address bits and data bits into the registers separately each time program or verify steps are performed creates a high vector count and typically causes undesirably long program and verify time delays. It would therefore be desirable to provide a more efficient technique for programming and verifying data in a programmable circuit.

BRIEF SUMMARY OF THE INVENTION

The present invention includes techniques for programming and verifying data in a programmable circuit. Programmable circuits such as programmable logic circuits (PLDs) may include a plurality of rows (i.e., word lines) and columns. Data is programmed into memory elements associated with the rows and columns. Subsequently, the programmed data may be extracted for verification.

The present invention provides techniques for performing program and verify steps for each set of word line address bits in the row shift registers. A first word line may be selected by first word line address bits in row shift registers. Data programmed into the first word line is loaded into column shift registers for verification during one or more verify steps. During a program step, data is programmed into memory elements in a second word line that is selected by the first word line address bits.

The present invention reduces the number of times word line address bits are loaded into the row shift registers to select word lines for programming and verifying data. Data programmed into memory cells of a first word line is verified and memory cells in a second word line are programmed for each set of address bits in the row shift registers.

The present invention also provides a technique for shifting program data bits into the column shift registers at the same time that verify data bits are shifted out of the column shift registers. This technique reduces the number of times data bits are shifted into and out of the column shift registers. By reducing the number of times bits are loaded into the row and column shift registers, the present invention reduces time delays and the vector counts associated with programming and verifying data in programmable memory circuits.

DETAILED DESCRIPTION OF THE INVENTION

Figure 1:
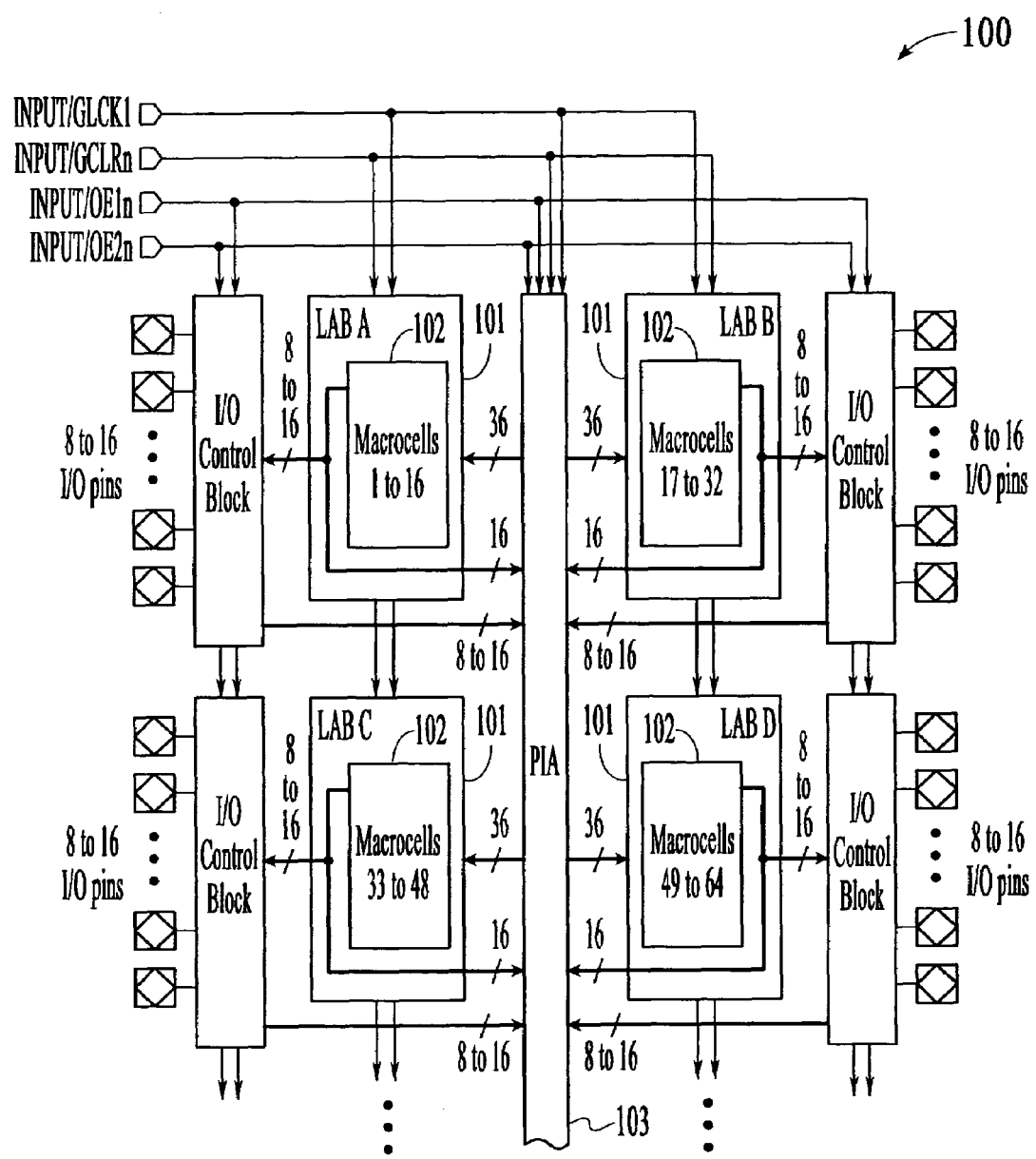
FIG. 1 is a diagram of a programmable logic device with macrocells.

FIG. 1 illustrates a diagram of a programmable logic device (PLD) 100. PLD 100 includes a plurality of logic array blocks (LABs) 101. Programmable interconnect array 103 routes signals between LABs 101. PIA 103 includes interconnection conductors and memory elements such as EEPROM cells. Each LAB 101 includes a set of sixteen macrocells 102. Each macrocell includes a plurality of non-volatile memory cells such as EEPROM cells. The memory cells are typically arranged in a series of rows and columns. Data can be programmed into the memory cells from column shift registers (not shown).

Input and output signals can be routed between the I/O pins and the macrocells 102 via the I/O control blocks. The I/O control blocks are coupled to receive two output enable signals (OE1n and OE2n). PLD 100 also includes a clock signal GCLK1 and a clear signal GCLRn.

Figure 2A:
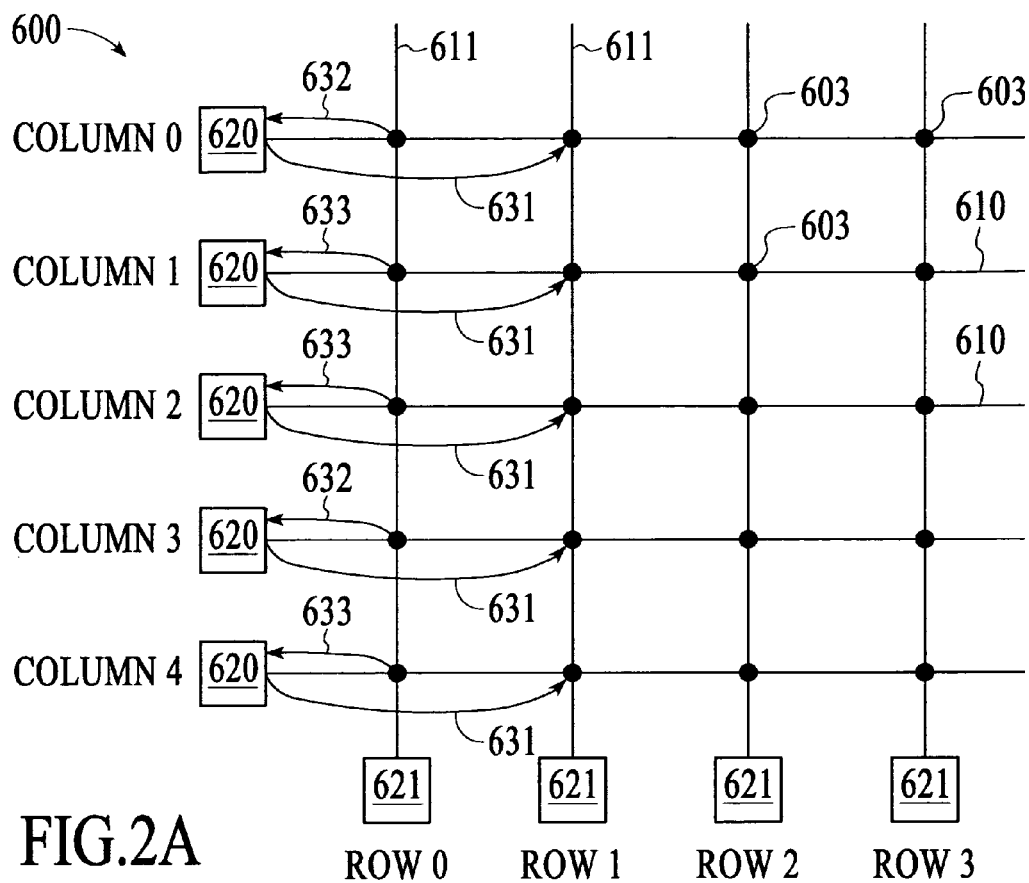
FIGS. 2A–2B are diagrams illustrating circuitry associated with programming and verifying data in a programmable circuit, in accordance with the present invention.

FIG. 2A illustrates a simplified diagram of a programmable circuit 600. Programmable circuit 600 may, for example, be a PLD. Programmable circuit 600 includes a plurality of column interconnection conductors 610 and a plurality of row interconnection conductors 611. Each row interconnection conductor 611 is coupled to a row shift register 621, and each column interconnection conductor 610 is coupled to a column shift register 620. The row and column interconnection conductors may be global interconnection conductors that are coupled to local row and column interconnection conductors in a multi-tiered hierarchy of interconnection conductors.

Programmable memory elements 603 are associated with the intersection point of each row and column interconnection conductor. If programmable circuit 600 includes a multi-level hierarchy of interconnection conductors, programmable memory elements 603 are coupled to row and column conductors 610–611 through lower level interconnection conductors. Macrocells are examples of memory elements 603. Each programmable memory element 603 may represent a plurality of memory storage units.

Figure 2B:
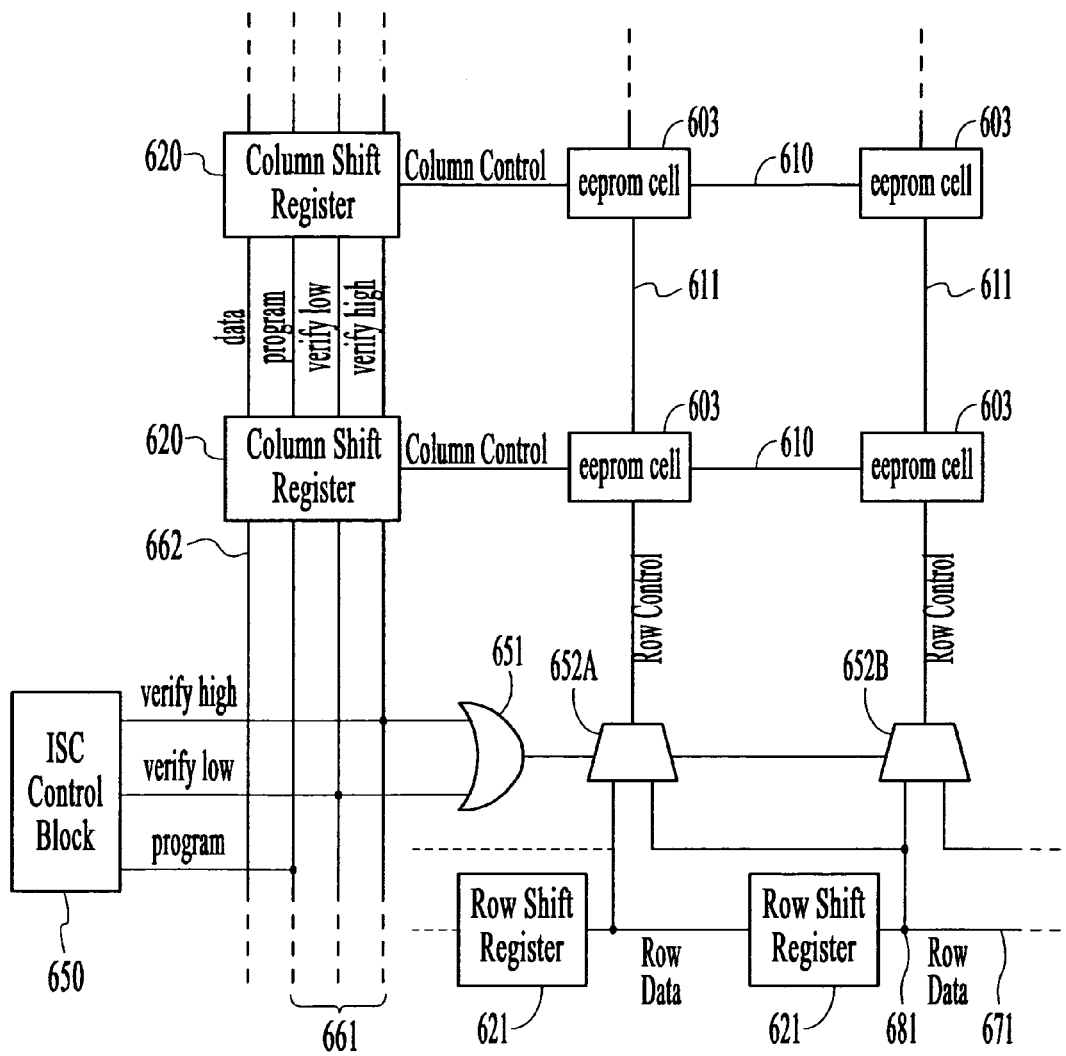

FIG. 2B illustrates a more detailed diagram of a programmable circuit with associated circuitry for programming and verifying data in memory elements 603. ISC control block 650 outputs three control signals, verify HIGH, verify LOW, and program. Column shift registers 620 receive each of the three control signals along signal lines 661 as shown in FIG. 2B. Signal lines 661 are coupled to each of the column shift registers 620. Data signals are shifted into column shift registers 620 along signal line 662.

The verify LOW and verify HIGH signals are coupled to NOR gate 651. The output of NOR gate 651 is coupled to the select inputs of multiplexers 652. Row address bits are shifted into row shift registers 621 along signal line 671. The two inputs of each of multiplexers 652 are coupled to a first and a second row shift register 621, as shown in FIG. 2B. Memory elements 603 may, for example, comprise EEPROM cells.

Figure 3:
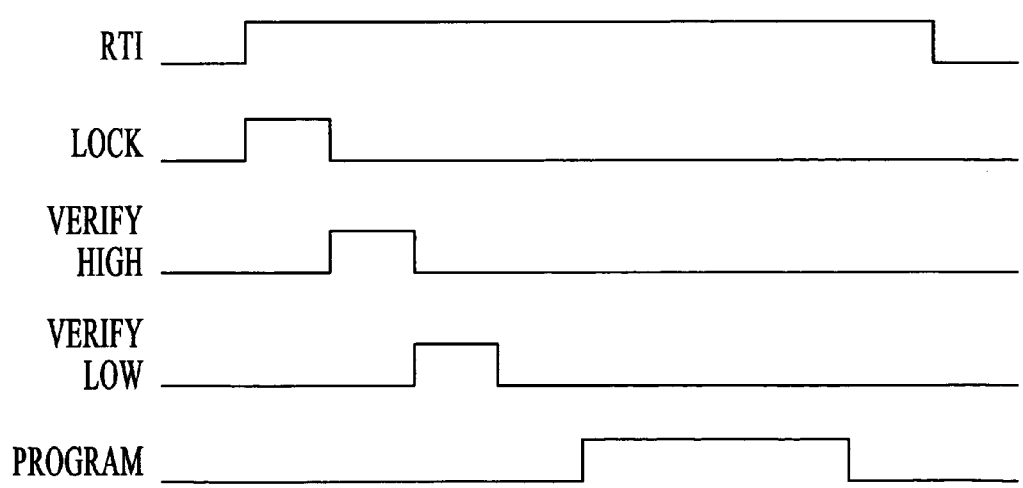
FIG. 3 is a timing diagram illustrating control signals used for programming and verifying data in a programmable circuit, in accordance with the present invention.

Data can be programmed into memory elements 603 and verified to determine its accuracy as will now be discussed. FIG. 3 illustrates example waveforms of five signals that can be used to program and verify data in a programmable circuit in accordance with the present invention. The five signals include a run test idle (RTI) signal, a Lock signal, a verify HIGH signal, a verify LOW signal, and a program signal. Other verify signals such as a verify normal signal may also be used with the present invention.

Figure 6:
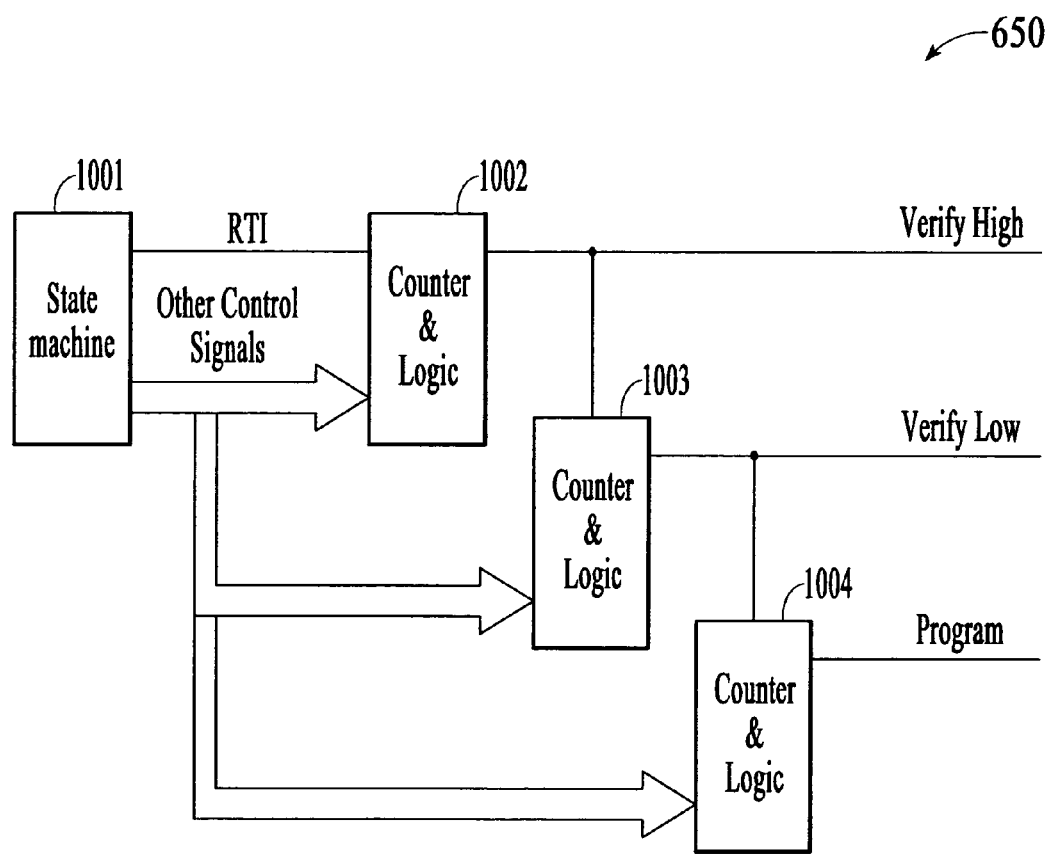
FIG. 6 is a diagram of an ISC control block, in accordance with the present invention.

FIG. 6 illustrates a more detailed diagram of ISC control block 650. ISC Control block 650 includes state machine 1001 and counter and logic blocks 1002–1004. State machine 1001 includes JTAG circuitry. The configuration of state machine 1001 is well-known to those of skill in the art. State machine 1001 outputs the RTI signal and other controls signals (e.g., clock signals) that are coupled to each of control and logic blocks 1002–1004. Timing circuitry within block 1002 begins to count when RTI goes HIGH. The timing circuitry ensures that the rising edge of the verify HIGH signal is delayed a period of time after the rising edge of RTI, as shown in FIG. 3. Circuit 1001 may provide the Lock signal.

The output of block 1002 that provides verify HIGH is coupled to an input of block 1003. After the rising edge of the verify HIGH signal, timing circuitry within block 1003 begins to count. The timing circuitry within block 1003 ensures that the rising edge of the verify LOW signal is delayed a period of time after the rising edge of verify HIGH, as shown in FIG. 3. The output of block 1003 that provides verify LOW is coupled to an input of block 1004. After the rising edge of the verify LOW signal, timing circuitry within block 1004 begins to count. The timing circuitry within block 1004 ensures that the rising edge of the Program signal is delayed a period of time after the rising edge of the verify LOW signal, as shown in FIG. 3. Thus, ISC control block 650 provides the delays between the rising edges of the control signals.

The delays should be long enough to account for delays in the program and verify steps. Preferably, there is a delay between the falling edge of verify HIGH and the rising edge of verify LOW, and a delay between the falling edge of verify LOW and the rising edge of Program. In a further embodiment, the program and verify signals can be inverted and the circuitry adjusted such that the program and verify steps are activated by the falling edges of the control signals instead of the rising edges.

Figure 4:
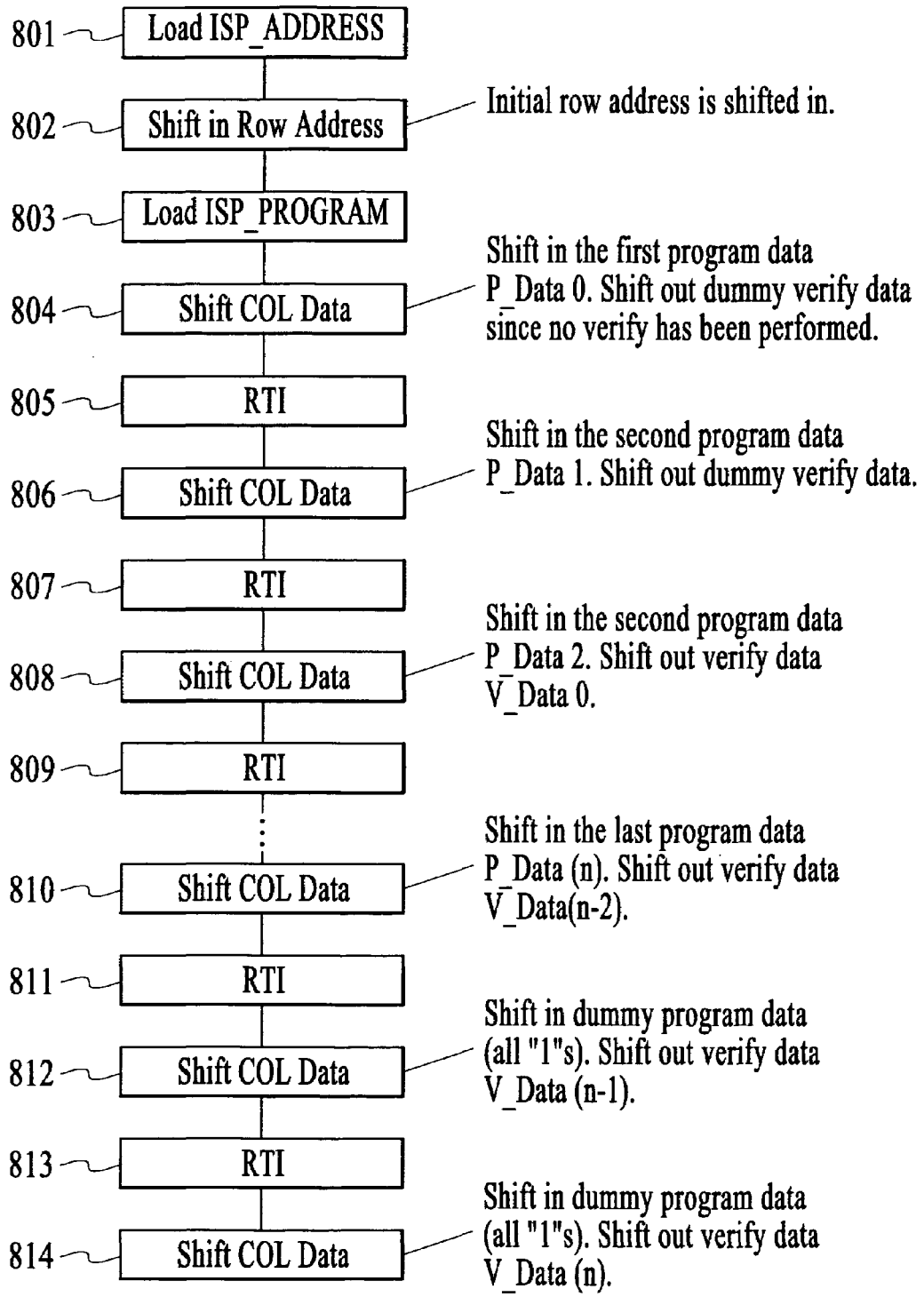
FIG. 4 is a flow chart illustrating steps that are performed to program and verify data in a programmable circuit, in accordance with the present invention.

FIG. 4 illustrates a flow chart of steps that may be performed to program and verify data in a programmable circuit in In-System Configuration (ISC) mode in accordance with the present invention. At step 801, ISP (in-system programming) address bits corresponding to a first one of the word lines (e.g., row 0) of programmable circuit 600 are loaded into registers that are external to programmable circuit 600 (e.g., an HP tester). At step 802, the word line address bits are shifted from the external registers into row shift registers 621. The word line address bits are a series of bits that select one or more of rows 611 of programmable circuit 600 once they are loaded into registers 621. Only memory cells in the row selected by the word line address bits can be programmed with data or verified.

At step 803, ISP program data bits are loaded into registers that are external to programmable circuit 600. At step 804, the program data bits are shifted from the external registers into column shift registers 620. The program data bits are data bits that are intended to be programmed into memory elements 603 of a word line selected by the word line address bits loaded into row shift registers 621. For example, if the word line address bits in registers 621 select row 0, then the data bits loaded into column shift registers 620 are programmed into memory cells 603 of row 0 during the program step.

When program data bits are shifted into column shift registers 620 during step 804, the bits previously stored in registers 620 are shifted out. The previously stored bits may be verify bits from a previous verify step, as will be discussed below. However, because verify steps have not been performed yet, the bits shifted out of registers 620 are "dummy" verify data.

Figure 5:
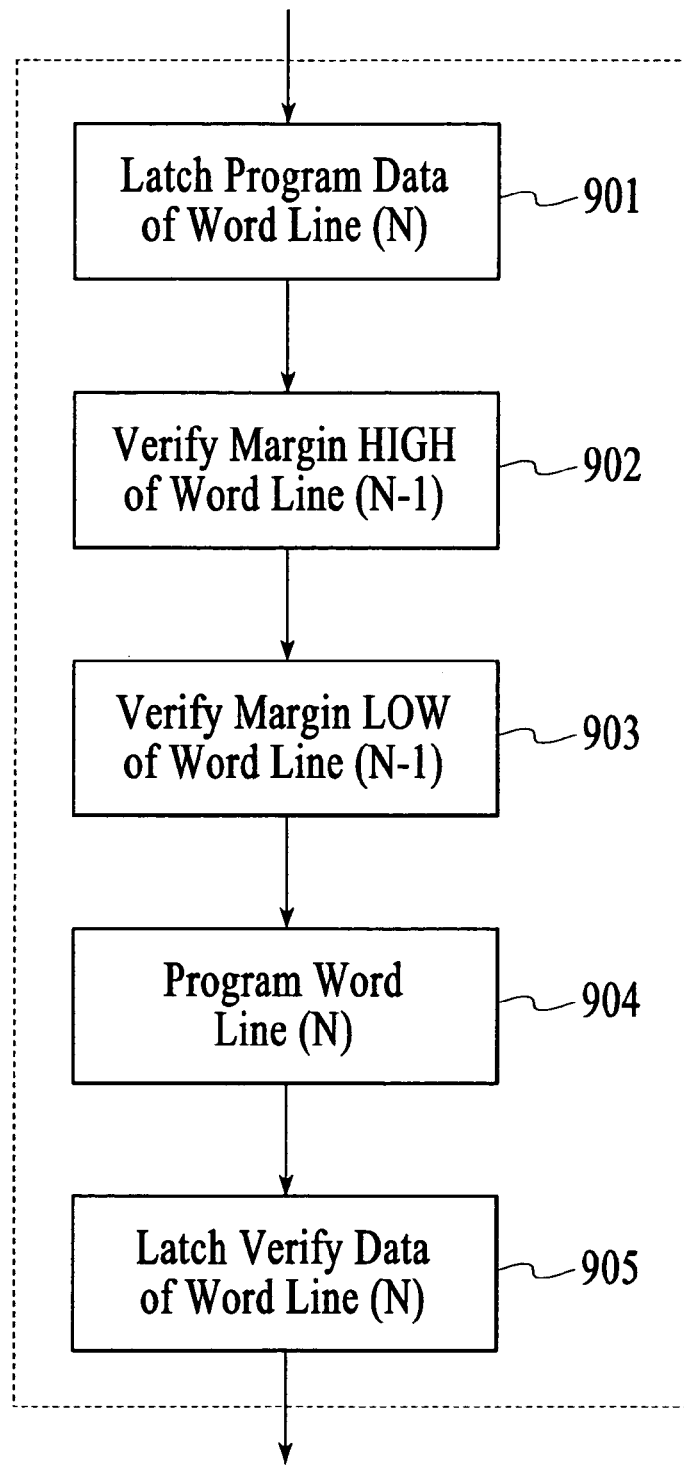
FIG. 5 is a flow chart illustrating more detailed steps that are performed to program and verify data in a programmable circuit, in accordance with the present invention.

At step 805, run test idle (RTI) steps are performed. FIG. 5 illustrates examples of run test idle (RTI) steps 805, 807, 809, 811, and 813 that may be performed to program and verify data in a selected word line of a programmable circuit. Any number of verify steps may be performed on data programmed into memory cells 603. For example, two verify steps, such as verify HIGH and verify LOW, may be performed on data programmed into each row of memory cells. Verify HIGH is a verify step that verifies the data bits in the memory cells 603 of a selected word line that are programmed to a logic HIGH state. Verify LOW is a verify step that verifies the data bits in the memory cells 603 of a selected word line that are programmed to a logic LOW state. Other verify steps may also be performed. For example, a verify NORMAL step may be performed during RTI that determines which bits programmed in memory cells 603 of a selected word line are in a undefined region between HIGH and LOW states.

Figure 7:
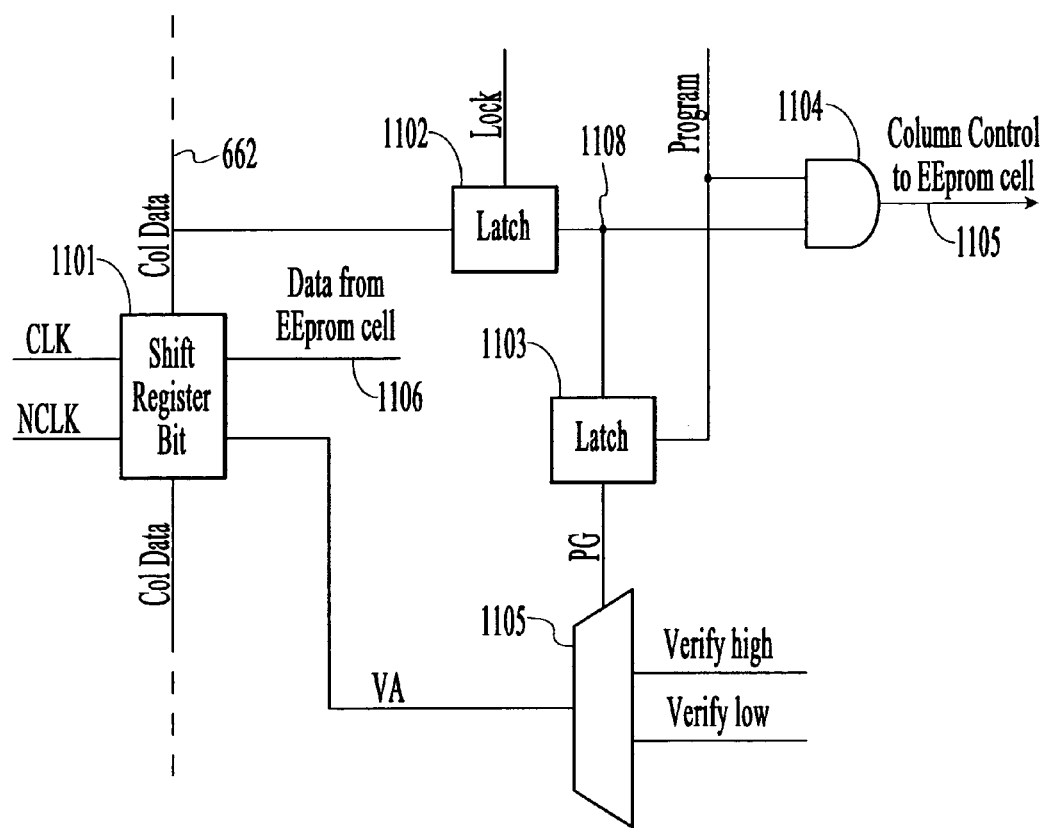
FIG. 7 is a diagram of circuitry associated with a column shift register, in accordance with the present invention.

FIG. 7 illustrates a detailed diagram of circuitry associated with each of column shift registers 620. Each register 620 is associated with a shift register bit circuit 1101, latches 1102–1103, AND gate 1104, and multiplexer 1105. The output of AND gate 1104 is coupled to the memory cells 603 in a column through signal line 1105. Shift register bit circuitry 1101 is coupled to the memory cells 603 in a column through signal line 1106.

Shift register bit circuit 1101 includes a register circuit. The program data for the first selected word line N (e.g., row 0) is shifted into shift register bit circuits 1101 of each of column registers 620 at step 804. Shift register bit circuit 1101 is coupled to receive clock signals CLK and NCLK. The clock signals CLK and NCLK control the shifting of data bits in and out of shift register bit circuits 1101.

Referring now to FIG. 5, after step 804, RTI steps 805 are performed when the RTI signal is HIGH as shown in FIG. 3. When the Lock signal goes HIGH, latch 1102 is activated, and the program data bit in shift register bit circuit 1101 is stored by latch 1102 at step 901. The Lock signal goes HIGH on the rising edge of RTI (or shortly thereafter). Latch 1102 stores the program data bit in register 1101 at node 1108, which coupled to an input of AND gate 1104, at step 901.

When the verify HIGH signal is HIGH, the system attempts to perform a verify HIGH step to verify data stored in memory cells 603 of the previously programmed word line one row to the left (N-1) of the selected word line, at step 902. When the verify LOW signal is HIGH, the system attempts to perform a verify LOW step to verify data stored in memory cells 603 of the previously programmed word line one row to the left (N-1) of the selected row, at step 903. When the verify LOW signal or the verify HIGH is HIGH, the output of OR gate 651 in FIG. 2A is HIGH. OR gate 651 is coupled to the select input of multiplexers 652. When the output of OR gate 651 is HIGH, multiplexers 652 select the previously programmed word line. Because there is no previously programmed word line to the left of row 0, the verify steps are not performed in the first iteration of RTI steps 902 and 903.

The verify steps are typically performed on the memory cells of word lines that were programmed in a previous cycle. The verified word line may bear a predetermined relationship to the programmed word line. In the present example, data in the previously programmed row N-1 is verified in each iteration, where N is the row being programmed in the current iteration. In another example, data in the row programmed two iterations ago (N-2) with respect to the row currently being programmed is verified.

When the program signal is HIGH, the program data bits stored in latches 1102 associated with each of column shift registers 620 are programmed into memory cells 603 for the selected word line N (row 0) at step 904. At step 904, Program goes HIGH at a first input of AND gate 1104, allowing the data bit at node 1108 to pass through AND gate 1104 to the memory cell 603 in the selected word line (row 0) through signal line 1105.

Also, when the Program signal is HIGH, latch 1103 is activated. Latch 1103 passes the data bit signal at the output of latch 1102 to the select input (PG) of multiplexer 1105 at step 905. Latch 1103 stores the PG signal at the select input of multiplexer 1105 until the next rising edge of the Program signal. The data bit signal at PG determines which verify signal (verify HIGH or verify LOW) is selected by multiplexer 1105 during the next verification step.

To program data bits in a second word line (row 1), an external circuit increments the row address bits in row shift registers 621 by one. The operation of this external circuit is well-known to those of skill in the art. The address bits in row shift registers 621 can now select row 1 or row 0, depending on the state of multiplexers 652.

Referring again to FIG. 4, program data bits for the second word line (row 1) are shifted into column shift registers 620, and the dummy verify data stored in column shift registers 620 is shifted out at step 806. The program data bits are stored by shift register bit circuits 1101 in each column shift register 620. Subsequently, RTI steps 807 are performed as shown in further detail in FIG. 5. When the Lock signal is HIGH, the program data for row 1 is stored by latches 1102 at node 1108 (step 901).

The VA signal at the output of multiplexer 1105 determines whether a verify HIGH or a verify LOW step is performed for a particular column of memory cells. A verify HIGH step is performed when the data bit stored in a memory cell 603 is a logic HIGH. When the verify HIGH signal is HIGH, the HIGH data bits are transferred from the selected word line to corresponding shift register bit circuits 1101 through signal line 1106. A verify LOW step is performed when the data bit stored in a memory cell 603 is a logic LOW. When the verify LOW signal is HIGH, the LOW data bits are transferred from the selected word line to corresponding shift register bit circuits 1101 through signal line 1106.

The PG signal determines whether multiplexer 1105 selects verify HIGH or verify LOW. If the data bit stored in memory cell 603 in a particular column during the previous program step was a HIGH bit, then multiplexer 1105 passes the verify HIGH signal to the VA signal line in response to the PG signal being HIGH. If the data bit stored in memory cell 603 in a particular column during the previous program step was a LOW bit, then multiplexer 1105 passes the verify LOW signal to the VA signal line in response to the PG signal being LOW.

When the verify HIGH signal is HIGH, a verify HIGH step is performed to verify data stored in memory cells 603 of the previously programmed word line (row 0), at step 902. The address bit at node 681 may, for example, select row 1 for programming and row 0 for verification. After the rising edge of verify HIGH, the output signal of OR gate 651 goes HIGH, causing the multiplexer 652A to select row 0 for a verify step by passing the address bit at node 681 to row 0. Multiplexer 652B deselects row 1 in response to the output signal of OR gate 651 by decoupling node 681 from row 1.

Multiplexers 1105 pass the verify HIGH signal to shift register bit circuit 1101 if memory cell 603 in the previously programmed word line (row 0) stores a HIGH data bit (as indicated by the state of the PG signal). When the verify signal is HIGH, the HIGH data bits in row 0 are loaded into shift register bit circuits 1101 through signal lines 1106. For example, if the data bits in row 0 of FIG. 2A correspond to 10010, the HIGH data bits in memory elements 603 of row 0 are stored in column shift registers 620, as shown by arrows 632. Only HIGH data bits are verified during a verify HIGH step.

The verify HIGH step occurs while the verify HIGH signal is HIGH (FIG. 3). The verify HIGH signal is preferably HIGH long enough to allow data to be successfully transferred from the memory cells of a row to registers 620. A short delay may be provided between the falling edge of verify HIGH and the rising edge of verify LOW.

When the verify LOW signal is HIGH, a verify LOW step is performed to verify data stored in memory cells 603 of the previously programmed word line (row 0), at step 903. When the verify LOW signal is HIGH, the output signal of OR gate 651 remains HIGH. Multiplexer 652A continues to select row 0, and multiplexer 652B continues to deselect row 1.

Multiplexers 1105 passes the verify LOW signal to shift register bit circuit 1101 if memory cell 603 in a column of the previously programmed word line (row 0) stores a LOW data bit (as indicated by the state of the PG signal). When the verify LOW signal is HIGH, the LOW data bits in row 0 are loaded into shift register bit circuits 1101 through signal lines 1106. For example, if the data bits in row 0 of FIG. 2A correspond to 10010, the LOW data bits in memory elements 603 of row 0 are stored in registers 620, as shown by arrows 633. Only LOW bits are verified during a verify LOW step.

The verify LOW step occurs while the verify LOW signal is HIGH (FIG. 3). The verify LOW signal is preferably HIGH long enough to allow data to be successfully transferred from the memory cells of a row to registers 620. A delay may be provided between the falling edge of verify LOW and the rising edge of the program signal.

When the Program signal is HIGH, data bits in row 1 are programmed at step 904. After the falling edge of the verify LOW signal, the output signal of OR gate 651 goes LOW, causing multiplexer 652A to deselect row 0 by decoupling node 681 from row 0. Multiplexer 652B selects row 1 by passing the address bit at node 681 to row 1. At step 904, AND gate 1104 passes the data bits stored by latches 1102 to memory elements 603 in row 1 through signal lines 1105. The data bits are then stored in memory elements 603 of row 1.

Arrows 631 in FIG. 2A illustrate the transfer of data from column shift registers 620 to memory elements 603 in row 1. The program signal is preferably HIGH long enough to allow data to be successfully transferred from latches 1102 to the memory cells of a selected row. At step 905, latch 1103 transfers the data bit stored by latch 1102 to the select input (PG) of multiplexer 1105 in response to the Program signal.

To program data bits in a third word line (row 2), the external circuit mentioned above increments the row address bits in row shift registers 621 by one. The address bits in row shift registers 621 can now select row 2 or row 1, depending on the state of multiplexers 652.

At step 808, program data bits for the third word line (row 2) are shifted into registers 1101, while the verify data for row 0 stored in registers 1101 is shifted out to external memory where it can be tested and verified. Then, RTI steps 809 are performed as shown in further detail in FIG. 5. The program data bits for row 2 are stored by latch 1102 at step 901. When the verify HIGH signal goes HIGH at step 902, the HIGH data bits of memory cells 603 in row 1 are loaded into shift register bit circuits 1101 through signal lines 1106 for subsequent verification. When the verify LOW signal goes HIGH at step 903, the LOW data bits of memory cells 603 in row 1 are loaded into shift register bit circuits 1101 through signal lines 1106 for subsequent verification. When the Program signal goes HIGH at step 904, data bits stored in latches 1102 are programmed into memory cells 603 of row 2 through signal lines 1105. At step 905, the data bits stored by latches 1102 are stored by latches 1103 at the select inputs of multiplexers 1105.

Steps 808 and 809 are repeated to program data bits into each word line in programmable circuit 600 and to verify data programmed into the previously programmed word line. The row address bits in row shift registers 621 are incremented to select the next word line before each set of RTI steps (805, 807, 809, 811, 813, etc.). Verify data bits for a programmed word line (N-2) are concurrently shifted out of column shift registers 620 while the program data bits for the next word line N are shifted into column shift registers 620. This technique saves time and reduces the vector count.

At step 810, program data bits for the last word line N in circuit 600 are shifted into column shift registers 620, while verify data bits for word line (N-2) are shifted out of registers 620 for external verification. At step 811, RTI steps are performed as discussed above with respect to FIG. 5 to extract data from word line (N-1) for verification and to program data bits into word line N (the last row).

At step 812, the verify data for word line (N-1) is shifted out of registers 620, and dummy program data is shifted into registers 620, because there are no more word lines left to program. At step 813, RTI steps are performed as discussed above with respect to FIG. 5 to extract and store verify data from word line N (the last row). Data bits are not programmed into any of memory cells 603 during step 813. At step 814, dummy program bits are shifted into column shift registers 620, while the verify data from the last word line N is shifted out of registers 620 for external verification.

Each word line address in the row shift registers selects a first word line for programming data and a second word line for verifying data. Because a program step and at least one verify step are performed for each set of word line address bits, all of the word lines in circuit 600 can be programmed and verified by shifting word line address bits into the row shift registers only one time. The address bits are incremented to select each subsequent word line.

Relative to standard prior art techniques, the present invention reduces the number of times the word line address bits are loaded into the row shift registers to program and verify data in each word line. The present invention also reduces the number of times program and verify data bits are shifted into and out of the column shift registers, because program data bits are shifted into the column shift registers at the same time that verify data bits are shifted out of the column shift registers. By reducing the number of times bits are shifted into and out of the row and the column shift registers, the techniques of the present invention reduce the time delays and vector counts associated with programming and verifying data in memory cells of a programmable circuit.

In another embodiment, the verify LOW signal can verify HIGH data bits stored in the memory cells, and the verify HIGH signal can verify LOW data bits stored in the memory cells. In a further embodiment, the verify HIGH and verify LOW steps can be combined into one verify step that loads HIGH and LOW bits into registers 1101 at the same time in response to one verify signal.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope of the invention as set forth. Therefore, many modifications may be made to adapt a particular situation or material to the teachings of the invention without departing from the essential scope and spirit of the present invention. It is intended that the invention not be limited to the particular embodiment disclosed as the best mode contemplated for carrying out this invention, but that the invention will include all embodiments and equivalents falling within the scope of the claims.

What is claimed is:

1. A method for programming and verifying data in a programmable circuit, the method comprising:
    shifting first data bits into first registers;
    loading second data bits from first memory cells into the first registers, the first memory cells being in a first word line selected by first address bits in second registers;
    selecting, by a selection circuit responsive to the first address bits, a second word line;
    loading the first data bits into second memory cells, the second memory cells being in the second word line.

2. The method of claim 1 further comprising:
storing the first data bits using a first set of latches after the first data bits are shifted into the first registers, and wherein the first data bits are loaded into the second memory cells from the first set of latches.

3. The method of claim 2 further comprising:
storing the first data bits using a second set of latches after the first data bits are stored using the first set of latches, each of the second set of latches being coupled to the selection circuit.

4. The method of claim 3 further comprising:
for each of the selection circuits,
selecting a first signal for loading the second data bits from the first memory cells into the first registers or a second signal for loading third data bits from the first memory cells into the first registers.

5. The method of claim 1 wherein loading the second data bits from the first memory cells into the first registers further comprises:
loading a first subset of the second data bits that have a first logic state from the first memory cells into the first registers in response to a first verify control signal, and loading a second subset of the second data bits that have a second logic state from the first memory cells into the first registers in response to a second verify control signal.

6. The method of claim 1 wherein the first word line is adjacent to the second word line, and the first address bits select the first and second word lines using another selection circuit that is responsive to a verify control signal.

7. The method of claim 1 further comprising:
shifting the second data bits out of the first registers while shifting third data bits into the first registers.

8. The method of claim 7 further comprising:
loading the first data bits from the second memory cells into the first registers, the second memory cells being in the second word line selected by second address bits in the second registers; and
loading the third data bits into third memory cells, the third memory cells being in a third word line selected by the second address bits.

9. The method of claim 8 wherein loading the first data bits from the second memory cells into the first registers further comprises:
loading a first subset of the first data bits from the second memory cells into the first registers in response to a first verify control signal, and loading a second subset of the first data bits from the second memory cells into the first registers in response to a second verify control signal.

10. A programmable circuit comprising:
a plurality of memory cells arranged in rows and columns;
first registers, each of the first registers being coupled to one of the rows of memory cells through interconnection conductors, first address bits being stored in the first registers; and
second registers, each of the second registers being coupled to one of the columns of memory cells through interconnection conductors, first data bits stored in a first row of the memory cells being loaded into the second registers when the first row is selected by the first address bits via a selection circuit, and second data bits stored in the second registers being programmed into a second row of the memory cells when the second row is selected by the first address bits via the selection circuit.

11. The programmable circuit of claim 10 wherein each of the first registers is coupled to two rows of the memory cells through the selection circuit.

12. The programmable circuit of claim 10 wherein each of the second registers is coupled to a first latch that stores the second data bits before the second data bits are programmed into the second row of the memory cells.

13. The programmable circuit of claim 12 wherein each of the first latches is coupled to a second latch that stores one of the second data bits,
each of the second latches being coupled to the select input of the selection circuit that selects a first verify control signal or a second verify control signal.

14. The programmable circuit of claim 13 wherein a first subset of the first data bits having a first logic state are loaded into the second registers in response to the first verify control signal, and a second subset of the first data bits having a second logic state are loaded into the second registers in response to the second verify control signal.

15. The programmable circuit of claim 10 further comprising:
a control block that provides a program signal and a verify signal,
wherein the second data bits stored in the second registers are programmed into the second row of the memory cells in response to the program signal, and
the first data bits stored in the first row of the memory cells are loaded into the second registers in response to the verify signal.

16. The programmable circuit of claim 10 wherein second address bits stored in the first registers select the second row of the memory cells and a third row of the memory cells, and
the second data bits stored in the second row of the memory cells are loaded into the second registers when the second row is selected by the second address bits, and third data bits stored in the second registers are programmed into the third row of the memory cells when the third row is selected by the second address bits.

17. The programmable circuit of claim 16 wherein third address bits stored in the first registers select the third row of the memory cells and a fourth row of the memory cells, and
the third data bits stored in the third row of the memory cells are loaded into the second registers when the third row is selected by the third address bits, and fourth data bits stored in the second registers are programmed into the fourth row of the memory cells when the fourth row is selected by the third address bits.

18. The programmable circuit of claim 17 wherein fourth address bits stored in the first registers select the fourth row of the memory cells, and
the fourth data bits stored in the fourth row of the memory cells are loaded into the second registers when the fourth row is selected by the fourth address bits.

19. A programmable circuit comprising:
means for selecting a first row and a second row of memory cells using first address bits;
means for verifying first data programmed into the first row of memory cells;
means for programming second data into the second row of memory cells;
means for selecting the second row and a third row of memory cells using second address bits;
means for verifying the second data programmed into the second row of memory cells; and means for programming third data into the third row of memory cells.

20. The programmable circuit of claim 19 further comprising:
   means for selecting the third row and a fourth row of memory cells using third address bits;
   means for verifying the third data programmed into the third row of memory cells; and
   means for programming fourth data into the fourth row of memory cells.

21. A method for programming and verifying data in a programmable circuit, the method comprising:
   shifting first data bits into first registers;
   loading second data bits from first memory cells in a first word line into the first registers, the first memory cells being selected by a selection operation using first address bits;
   selecting a second word line using a second selection operation using the first address bits;
   loading the first data bits into second memory cells in the second word line;
   shifting third data bits into the first registers while shifting the second data bits out of the first registers; and
   loading the third data bits into third memory cells in a third word line.

22. The method of claim 21 further comprising:
   loading the first data bits from the second memory cells into the first registers; and
   shifting fourth data bits into the first registers while shifting the first data bits out of the first registers.

23. The method of claim 22 wherein loading the second data bits from the first memory cells into the first registers comprises selecting the first word line with first address bits in second registers;
   and wherein loading the first data bits into second memory cells in the second word line comprises selecting, via a selection circuit, the second word line with the first address bits in the second registers.

24. The method of claim 23 wherein loading the first data bits from the second memory cells into the first registers comprises selecting the second word line with second address bits in the second registers; and
   wherein loading the third data bits into the third memory cells comprises selecting the third word line, via the selection circuit, with the second address bits in the second registers.

25. A programmable circuit comprising:
   a plurality of memory cells arranged in rows and columns;
   a first plurality of registers, each of the registers being coupled to one of the columns of memory cells through interconnection conductors, wherein first data bits stored in a first row of the memory cells are loaded into the first registers; wherein the memory cells are in a first word line selected by a selection circuit responsive to first address bits; and
   a first plurality of latches, each of the latches being coupled to one of the first plurality of registers, wherein the first data bits are shifted out of the first registers while second data bits are shifted into the first registers, the second data bits being stored in the first plurality of latches and programmed into a second row of the memory cells; wherein the second row of memory cells are in a second word line selected by the selection circuit responsive to the first address bits.

26. The programmable circuit of claim 25 wherein the first row of the memory cells and the second row of the memory cells are selected by address bits in second registers, each of the second registers being coupled to one of the rows of memory cells through interconnection conductors.

* * * * *